US012626033B2

(12) United States Patent
Sharma et al.

(10) Patent No.: US 12,626,033 B2
(45) Date of Patent: May 12, 2026

(54) SIMULATING RESOURCE EXCHANGE IN MULTI-MACHINE ENVIRONMENT

(71) Applicant: INTERNATIONAL BUSINESS MACHINES CORPORATION, Armonk, NY (US)

(72) Inventors: Nitika Sharma, Zirakpur (IN); Akash U. Dhoot, Pune (IN); Shailendra Moyal, Pune (IN); Sarbajit K. Rakshit, Kolkata (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 470 days.

(21) Appl. No.: 17/651,362

(22) Filed: Feb. 16, 2022

(65) Prior Publication Data

US 2023/0259671 A1 Aug. 17, 2023

(51) Int. Cl.
*G06F 30/20* (2020.01)

(52) U.S. Cl.
CPC ..................................... *G06F 30/20* (2020.01)

(58) Field of Classification Search
CPC ....................................................... G06F 30/20
USPC ............................................................. 703/7
See application file for complete search history.

(56) References Cited

U.S. PATENT DOCUMENTS 8,112,176 B2 2/2012 Solomon
2025/0033517 A1* 1/2025 Hancock ................. B60L 53/66

OTHER PUBLICATIONS

Zhao_2011 (Large Plastic Deformation in High-Capacity Lithium-Ion Batteries Caused by Charge and Discharge, J. Am. Ceram. Soc. 2011). (Year: 2011).*
Jones_2020 (Characterizing the Digital Twin: a systematic literature review, CIRP Journal of Manufacturing Science and Technology 29 (2020) 36-52). (Year: 2020).*
Shintake_2018 (Soft Robotic Grippers DOI: 10.1002/adma. 201707035 Adv. Mater. 2018, 30, 1707035 (Year: 2018).*
Lazher_2019 (Task Allocation Based on Shared Resource Constraint for Multi-Robot Systems in Manufacturing Industry, IFAC PapersOnLine 52-13 (2019). (Year: 2019).*
Mayya_2021 (Resilient Task Allocation in Heterogeneous Multi-Robot Systems, IEEE Robotics and Automation Letters, vol. 6, No. Apr. 2, 2021). (Year: 2021).*

(Continued)

*Primary Examiner* — Brian S Cook
(74) *Attorney, Agent, or Firm* — Robert R. Aragona

(57) ABSTRACT

An embodiment for simulating an exchange of resources in a multi-machine environment is provided. The embodiment may include receiving data relating to an activity and one or more machines to perform the activity. The embodiment may also include identifying each part of the one or more machines. The embodiment may further include creating a digital twin model of each identified part. The embodiment may also include executing a digital twin simulation of the activity. The embodiment may further include in response to determining at least one machine is associated with an insufficient resource, identifying a required resource and at least one machine having the required resource. The embodiment may also include exchanging the insufficient resource of the at least one machine associated with the insufficient resource for the required resource of the at least one machine having the required resource.

17 Claims, 6 Drawing Sheets

(56) References Cited

OTHER PUBLICATIONS

Afrin, et al., "Resource Allocation and Service Provisioning in Multi-Agent Cloud Robotics: a Comprehensive Survey", IEEE Communications, Feb. 23, 2021, vol. 23, Issue 2, 29 Pages. https://ieeexplore.ieee.org/document/9360855.

Kato, et al., "Identifying and Localizing Robots in a Multi-Robot System Environment", IEEE Xplore, Feb. 1999, 13 Pages. https://ieeexplore.ieee.org/document/812805.

Kousi, et al., "Digital twin for adaptation of robots' behavior in flexible robotic assembly lines", Elsevier, (2019), pp. 121-126. https://www.sciencedirect.com/science/article/pii/S2351978918313623.

Vermesan, et al., "Internet of Robotic Things Intelligent Connectivity and Platforms", Frontiers in Robotics and AI, vol. 7, Article 104, Sep. 2020, 33 Pages. https://www.frontiersin.org/articles/10.3389/frobt.2020.00104/full.

Zhai et al., "Cooperative Offloading for Multiple Robot Applications", IEEE International Conference on Joint Cloud Computing (JCC), Sep. 5, 2020, pp. 63-70. https://ieeexplore.ieee.org/abstract/document/9183527.

Zong et al., "A Multi-robot Monitoring System Based on Digital Twin", Elsevier, 2021, pp. 94-99. https://www.sciencedirect.com/science/article/pii/S1877050921005007.

Mell et al., "The NIST Definition of Cloud Computing", Recommendations of the National Institute of Standards and Technology, NIST Special Publication 800-145, Sep. 2011, 7 pages.

\* cited by examiner

100

CLIENT COMPUTING DEVICE
102

PROCESSOR
104

DATA STORAGE
DEVICE 106

SOFTWARE
PROGRAM
108

RESOURCE
EXCHANGE
PROGRAM
110A

NETWORK    114

IOT DEVICE
118

SERVER 112

RESOURCE
EXCHANGE
PROGRAM
110B

DATABASE
116

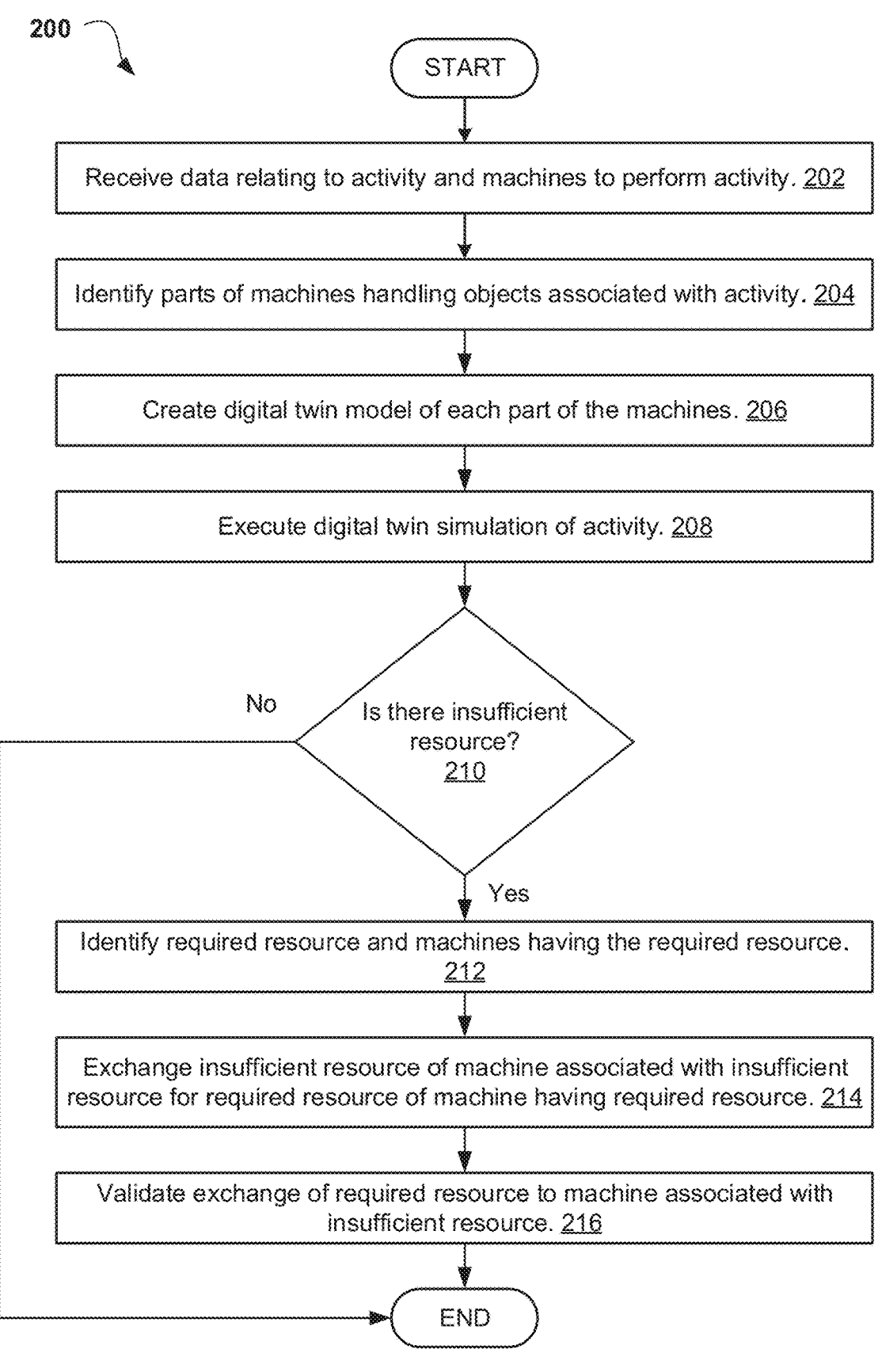

200

START

Receive data relating to activity and machines to perform activity. 202

Identify parts of machines handling objects associated with activity. 204

Create digital twin model of each part of the machines. 206

Execute digital twin simulation of activity. 208

Is there insufficient resource? 210

No

Yes

Identify required resource and machines having the required resource. 212

Exchange insufficient resource of machine associated with insufficient resource for required resource of machine having required resource. 214

Validate exchange of required resource to machine associated with insufficient resource. 216

END

Multi-machine environment

306

304

306

304

306

304

300

SIMULATING RESOURCE EXCHANGE IN MULTI-MACHINE ENVIRONMENT

BACKGROUND

The present invention relates generally to the field of computing, and more particularly to a system for simulating an exchange of resources in a multi-machine environment.

Machines, such as robots, are currently used to perform a wide variety of activities in an industrial environment. Some of these activities were previously exclusively performed by humans (e.g., repetitive tasks on a manufacturing assembly line), whereas other activities require heavy machinery to lift and/or move objects. Machines enable organizations, including manufacturers and construction companies, to carry out a wide variety of activities more seamlessly than humans, getting work done faster and with minimum wasted effort. These machines have differing skills and capabilities, and can perform activities individually and/or collaboratively. As automation becomes commonplace, the demand for machines and robotic technology is expected to increase in the coming decades.

SUMMARY

According to one embodiment, a method, computer system, and computer program product for simulating an exchange of resources in a multi-machine environment is provided. The embodiment may include receiving data relating to an activity and one or more machines to perform the activity. The embodiment may also include identifying each part of the one or more machines based on the data relating to the one or more machines. The embodiment may further include creating a digital twin model of each identified part of the one or more machines. The digital twin model of each identified part may be assembled to form a digital twin of the one or more machines. The embodiment may also include executing a digital twin simulation of the activity based on the digital twin of the one or more machines and the data relating to the activity. The embodiment may further include in response to determining at least one machine is associated with an insufficient resource, identifying a required resource and at least one machine of the one or more machines having the required resource based on the data relating to the one or more machines to perform the activity. The embodiment may also include exchanging the insufficient resource of the at least one machine associated with the insufficient resource for the required resource of the at least one machine having the required resource.

BRIEF DESCRIPTION OF THE SEVERAL VIEWS OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings:

FIG. 2 illustrates an operational flowchart for simulating an exchange of resources in a multi-machine environment in a resource exchange simulation process according to at least one embodiment.

DETAILED DESCRIPTION

Figure 1:
FIG. 1 illustrates an exemplary networked computer environment according to at least one embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

It is to be understood that the singular forms "a," "an," and "the" include plural referents unless the context clearly dictates otherwise. Thus, for example, reference to "a component surface" includes reference to one or more of such surfaces unless the context clearly dictates otherwise.

Embodiments of the present invention relate to the field of computing, and more particularly to a system for simulating an exchange of resources in a multi-machine environment. The following described exemplary embodiments provide a system, method, and program product to, among other things, determine whether an insufficient resource associated with a machine (e.g., low battery) is detected during a digital twin simulation and, accordingly, exchange the insufficient resource of the machine associated with the insufficient resource for a required resource of a machine having the required resource. Therefore, the present embodiment has the capacity to improve industrial machine technology by increasing the capabilities of machines with insufficient resources in any multi-machine environment.

As previously described, machines, such as robots, are currently used to perform a wide variety of activities in an industrial environment. Some of these activities were previously exclusively performed by humans (e.g., repetitive tasks on a manufacturing assembly line), whereas other activities require heavy machinery to lift and/or move objects. Machines enable organizations, including manufacturers and construction companies, to carry out a wide variety of activities more seamlessly than humans, getting work done faster and with minimum wasted effort. These machines have differing skills and capabilities, and can perform activities individually and/or collaboratively. As automation becomes commonplace, the demand for machines and robotic technology is expected to increase in the coming decades. When a machine is performing an activity, the machine may not have adequate resources to carry out the activity effectively. For example, the machine may have a low battery and/or the grippers of the machine may not be able to handle the weight of an object. This problem is typically addressed by performing a virtual simulation of robotic movements in a real-world environment for collision detection. However, simulating robotic movements to detect collisions fails to consider the proper allocation of resources in the multi-machine environment. It may therefore be imperative to have a system in place to seamlessly exchange already-available resources between the machines so that the activities may be effectively performed in the multi-machine environment. Thus, embodiments of the present invention may provide advantages including, but not limited to, seamlessly exchanging already-available resources between the machines in the multi-machine environment to perform activities effectively, dynamically allocating resources based on strengths and weaknesses of the machines in the multi-machine environment, and increasing the capabilities of machines with insufficient resources in the multi-machine environment. The present invention does not require that all advantages need to be incorporated into every embodiment of the invention.

According to at least one embodiment, in a multi-machine environment, data relating to an activity and one or more machines to perform the activity may be received in order to identify each part of the one or more machines based on the data relating to the one or more machines. Upon identifying each part of the one or more machines, a digital twin model of each identified part of the one or more machines may be created where the digital twin model of each identified part may be assembled to form a digital twin of the one or more machines. Then, a digital twin simulation of the activity may be executed based on the digital twin of the one or more machines and the data relating to the activity. In response to determining at least one machine of the one or more machines is associated with an insufficient resource, a required resource and at least one machine of the one or more machines having the required resource may be identified based on the data relating to the one or more machines to perform the activity so that the insufficient resource of the at least one machine associated with the insufficient resource may be exchanged for the required resource of the at least one machine having the required resource. According to at least one embodiment, the required resource may be a detachable part capable of performing the activity. According to at least one other embodiment, the required resource may be an adequate battery level to perform the activity. Upon exchanging the insufficient resource for the required resource, the exchange may be validated by executing an updated digital twin simulation with the required resource applied to the at least one machine associated with the insufficient resource.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed concurrently or substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The following described exemplary embodiments provide a system, method, and program product to determine whether an insufficient resource associated with a machine (e.g., low battery) is detected during a digital twin simulation and, accordingly, exchange the insufficient resource of the machine associated with the insufficient resource for a required resource of a machine having the required resource.

Referring to FIG. 1, an exemplary networked computer environment 100 is depicted, according to at least one embodiment. The networked computer environment 100 may include client computing device 102, a server 112, and Internet of Things (IoT) Device 118 interconnected via a communication network 114. According to at least one implementation, the networked computer environment 100 may include a plurality of client computing devices 102 and servers 112, of which only one of each is shown for illustrative brevity.

The communication network 114 may include various types of communication networks, such as a wide area network (WAN), local area network (LAN), a telecommunication network, a wireless network, a public switched network and/or a satellite network. The communication network 114 may include connections, such as wire, wireless communication links, or fiber optic cables. It may be appreciated that FIG. 1 provides only an illustration of one implementation and does not imply any limitations with regard to the environments in which different embodiments may be implemented. Many modifications to the depicted environments may be made based on design and implementation requirements.

Client computing device 102 may include a processor 104 and a data storage device 106 that is enabled to host and run a software program 108 and a resource exchange program 110A and communicate with the server 112 and IoT Device 118 via the communication network 114, in accordance with one embodiment of the invention. Client computing device 102 may be, for example, a mobile device, a telephone, a personal digital assistant, a netbook, a laptop computer, a tablet computer, a desktop computer, or any type of computing device capable of running a program and accessing a network. As will be discussed with reference to FIG. 4, the client computing device 102 may include internal components 402a and external components 404a, respectively.

The server computer 112 may be a laptop computer, netbook computer, personal computer (PC), a desktop computer, or any programmable electronic device or any network of programmable electronic devices capable of hosting and running a resource exchange program 110B and a database 116 and communicating with the client computing device 102 and IoT Device 118 via the communication network 114, in accordance with embodiments of the invention. As will be discussed with reference to FIG. 4, the server computer 112 may include internal components 402b and external components 404b, respectively. The server 112 may also operate in a cloud computing service model, such as Software as a Service (SaaS), Platform as a Service (PaaS), or Infrastructure as a Service (IaaS). The server 112 may also be located in a cloud computing deployment model, such as a private cloud, community cloud, public cloud, or hybrid cloud.

IoT Device 118 may be a machine, a robotic device, and/or any other automated or manual device known in the art for performing labor related tasks that is capable of connecting to the communication network 114, and transmitting and receiving data with the client computing device 102 and the server 112.

According to the present embodiment, the resource exchange program 110A, 110B may be a program capable of receiving data relating to an activity and one or more machines to perform the activity, determining whether an insufficient resource associated with a machine (e.g., low battery) is detected during a digital twin simulation, exchanging the insufficient resource of the machine associated with the insufficient resource for a required resource of a machine having the required resource, seamlessly exchanging already-available resources between the machines in the multi-machine environment to perform activities effectively, dynamically allocating resources based on strengths and weaknesses of the machines in the multi-machine environment, and increasing the capabilities of machines with insufficient resources in the multi-machine environment. The resource exchange simulation method is explained in further detail below with respect to FIG. 2.

Referring now to FIG. 2, an operational flowchart for simulating an exchange of resources in a multi-machine environment in a resource exchange simulation process 200 is depicted according to at least one embodiment. At 202, the resource exchange program 110A, 110B receives the data relating to the activity and the one or more machines to perform the activity. The data may be historical data and may be retrieved from an artificial intelligence (AI) corpus and/or a database, such as database 116.

The data relating to the activity may include the type of activity to be performed in the multi-machine environment.

Examples of an activity may include, but are not limited to, assembling objects in a manufacturing facility, moving objects at a construction site, and transporting objects from one location to another, (e.g., moving a product from an assembly line to a shipping area). The data relating to the activity may also include the one or more objects associated with the activity. Examples of an object may include, but are not limited to, a shipping container, an automobile, a device on an assembly line, construction materials, and/or any object capable of being moved from a source to a destination, i.e., from one location to another location. The data relating to the activity may further include the time required to complete the activity. For example, the activity may typically take two hours to complete. The data relating to the activity may also include common safety issues associated with the activity. For example, a particular activity may be associated with dropped objects by the machines performing the activity.

The data relating to the one or more machines to perform the activity may include the types of machines to perform the activity. Examples of a machine include, but are not limited to, a construction crane, a robot (i.e., an automated device), and/or any other machine known in the art capable of moving objects from a source to a destination, i.e., from one location to another location. The data relating to the one or more machines to perform the activity may also include the resources of the one or more machines that are required to perform the activity. Examples of a required resource include, but are not limited to, a detachable part (e.g., a gripper) of the one or more machines capable of performing the activity, and/or an adequate battery level (e.g., at least 50% battery life) to perform the activity. The resources required to perform the activity are described in further detail below with respect to step 212.

According to at least one embodiment, a user may specify the type of activity to be performed via a user interface (UI) on a device of the user. The user may be an individual who has background knowledge of the activity, such as a foreman or manager of an activity. For example, the user may specify that the activity to be performed is assembling an automobile on an assembly line. Based on the type of activity, the resource exchange program 110A, 110B may obtain the one or more objects associated with the activity, the time required to complete the activity, safety issues associated with the activity, the one or more machines to perform the activity, and the required resources of the one or more machines to perform the activity from the historical data in the AI corpus and/or the database 116. Continuing the example above, when the user specifies the activity to be performed is assembling the automobile on the assembly line, the resource exchange program 110A, 110B may obtain information that the objects are parts of the automobile (i.e., a hood, door, windshield etc.), the time required to complete the activity is two hours, objects are sometimes dropped during the activity, the machine to perform the activity is a robot with a gripper, and the required resource of the robot is at least 50% battery life. This data may be used in the digital twin simulation, described in further detail below with respect to step 208.

Then, at 204, the resource exchange program 110A, 110B identifies each part of the one or more machines. Each part is identified based on the data relating to the one or more machines. Each part of the one or more machines may be inferred from the types of machines to perform the activity described above with respect to step 202. For example, when the type of machine to perform the activity is a robot on an assembly line, the resource exchange program 110A, 110B may infer the parts of the robot via performing image analysis on digital images of robots typically used on the assembly line. In this example, these parts may include, but are not limited to, an arm, a gripper, a battery housing, a battery, and/or a base. Similarly, when the type of machine to perform the activity is a crane at a construction site, the resource exchange program 110A, 110B may infer the parts of the crane via performing image analysis on digital images of cranes typically used at the construction site.

According to at least one embodiment, the resource exchange program 110A, 110B may identify at least one detachable part of the one or more machines. The detachable part may be capable of being self-exchanged between the one or more machines (i.e., from one machine to another machine). For example, the gripper of the robot may be exchanged directly with the gripper of another robot. In another example, the battery of the robot may be exchanged directly with the battery of another robot. The exchange of resources is described in further detail below with respect to step 214.

Next, at 206, the resource exchange program 110A, 110B creates the digital twin model of each identified part of the one or more machines. The resource exchange program 110A, 110B may use known techniques to create the digital twin model of each identified part. The digital twin model of each identified part is assembled to form the digital twin of the one or more machines. This digital twin of the one or more machines may be used in the digital twin simulation, described in further detail below with respect to step 208.

Then, at 208, the resource exchange program 110A, 110B executes the digital twin simulation of the activity. The digital twin simulation of the activity is executed based on the digital twin of the one or more machines and the data relating to the activity. The digital twin of the one or more machines used in the simulation may have the same size and weight specifications these machines have in the real-world. Additionally, the digital twin of the one or more machines used in the simulation may also have the same materials these machines are made of in the real-world. For example, the arm of the machine may be made of a metal, such as titanium, and the gripper may be made of the same or different type of metal (e.g., aluminum), or the gripper may be made of plastic. This is to ensure maximum accuracy during the digital twin simulation. The digital twin simulation may be executed in accordance with the typical range of movements the one or more machines make in the real-world while performing the activity. For example, when the activity is assembling automobile parts on an assembly line, the range of movements may include picking up a door and a hood cover and placing them on a chassis.

According to at least one embodiment, multiple digital twin simulations may be executed where the resources of the one or more machines vary between simulations. For example, in one digital twin simulation, one machine may have 100% battery life and a titanium gripper and another machine may have 50% battery life and a plastic gripper. In another digital twin simulation, one machine may have 40% battery life and a titanium gripper and another machine may have 80% battery life and a plastic gripper. Varying the resources of the one or more machines in the digital twin simulation may allow the resource exchange program 110A, 110B to determine which machines are associated with an insufficient resource, described in further detail below with respect to step 210.

Next, at 210, the resource exchange program 110A, 110B determines whether the at least one machine of the one or more machines is associated with the insufficient resource to perform the activity. The determination is made based on the digital twin simulation. As described above with respect to step 208, the resource exchange program 110A, 110B executes the digital twin simulation of the activity, during which the one or more machines may perform the range of motions the one or more machines perform in the real-world. In any multi-machine environment, one or more of these machines may be associated with the insufficient resource. Examples of an insufficient resource include, but are not limited to, a detachable part that is not able to perform the activity, a deformity in at least one part (e.g., bending, twisting, and/or melting), and/or an inadequate battery level to perform the activity. For example, the detachable gripper made of plastic may melt when handling a hot object and/or where the internal temperature of the manufacturing facility reaches a threshold temperature for melting. Since titanium has a higher heat tolerance than plastic, a titanium gripper may serve as a suitable substitute for the plastic gripper, described in further detail below with respect to step 214. In another example, a dropped object may be an indication that the detachable part is not able to perform the activity. In yet another example, slowness in performing the activity may be an indication that the machine has an inadequate battery level to perform the activity. In any of the examples described above, the at least one machine may be associated with the insufficient resource to perform the activity.

In response to determining the at least one machine is associated with the insufficient resource (step 210, "Yes" branch), the resource exchange simulation process 200 proceeds to step 212 to identify the required resource and the at least one machine of the one or more machines having the required resource. In response to determining the at least one machine is not associated with the insufficient resource (step 210, "No" branch), the resource exchange simulation process 200 ends.

Then, at 212, the resource exchange program 110A, 110B identifies the required resource and the at least one machine of the one or more machines having the required resource. The identification is made based on the data relating to the one or more machines to perform the activity. As described above with respect to step 202, the data relating to the one or more machines to perform the activity may include the resources of the one or more machines that are required to perform the activity. The resource exchange program 110A, 110B may obtain this data from the AI corpus and/or the database 116. Examples of a required resource include, but are not limited to, a detachable part (e.g., a gripper) of the one or more machines capable of performing the activity, and/or an adequate battery level (e.g., at least 50% battery life) to perform the activity. Continuing the example above where the detachable gripper made of plastic melted during the digital twin simulation, the required resource may be the titanium gripper having the higher heat tolerance.

According to at least one embodiment, the at least one machine of the one or more machines having the required resource may be any machine that is not the at least one machine associated with the insufficient resource described above with respect to step 210. For example, the at least one machine having the required resource may be on pace to complete the activity within the typical timeframe described above with respect to step 202. Continuing the example, the at least one machine having the required resource may have at least 50% battery life. In another example, the at least one machine having the required resource may have a gripper that is capable of handling the weight of objects associated with the activity.

According to at least one embodiment, when the required resource is the adequate battery level to perform the activity, the at least one machine associated with the insufficient resource may obtain a charge via charge sharing with the at least one machine having the required resource. Charge sharing between two machines may be performed wirelessly or through a wire. According to at least one other embodiment, when the required resource is the adequate battery level to perform the activity, the at least one machine associated with the insufficient resource may obtain the battery of the at least one machine having the required resource via an exchange of resources, described in further detail below with respect to step 214.

Next, at 214, the resource exchange program 110A, 110B exchanges the insufficient resource of the at least one machine associated with the insufficient resource for the required resource of the at least one machine having the required resource. The detachable parts of the one or more machines may be exchanged directly between the machines (i.e., an intermediary is not required for the exchange of parts) in both the digital twin simulation and in the real-world. For example, when the plastic gripper is deemed to be an insufficient resource, the plastic gripper of the at least one machine associated with the insufficient resource may be exchanged for the titanium gripper of the at least one machine having the required resource.

According to at least one embodiment, the exchanging of the insufficient resource for the required resource may be performed optimally based on a time required to complete the exchange and a time required to complete the activity. As described above with respect to step 202, the data relating to the activity may include the time required to complete the activity. For example, the activity may typically take two hours to complete. When the time required to complete the exchange in the digital twin simulation would make the activity take three hours to complete, the resource exchange program 110A, 110B may identify a more optimum scenario for the exchange that would reduce the amount of time required to complete the activity. In this embodiment, one machine associated with the insufficient resource may also have the required resource, and another machine having the required resource may also be associated with the insufficient resource. Continuing the example above, consider Machine A and Machine B. When Machine A is a low battery machine (i.e., an insufficient resource) having the strongest gripper (i.e., a required resource) and Machine B is a high battery machine (i.e., a required resource) having the weakest gripper (i.e., the insufficient resource), the resource exchange program 110A, 110B may make a decision on whether to exchange the required resource from Machine A to Machine B, or alternatively from Machine B to Machine A. This decision may be made optimally. For example, when transferring the electrical charge from Machine B (i.e., the high battery machine) to Machine A (i.e., the low battery machine) would make the activity take three hours to complete, and transferring the gripper from Machine A (i.e., the machine with the strongest gripper) to Machine B (i.e., the machine with the weakest gripper) would make the activity take two hours to complete, the resource exchange program 110A, 110B may decide to transfer the required resource from Machine A to Machine B.

Then, at 216, the resource exchange program 110A, 110B validates the exchange by executing the updated digital twin simulation with the required resource applied to the at least one machine associated with the insufficient resource. The updated digital twin simulation may perform the same range of motions as in the digital twin simulation. In response to determining a problem is detected in the updated digital twin simulation, the required resource may be exchanged for an additional required resource. For example, the problem may be the dropping of an object and/or the melting of the detachable part even when the required resource identified in the original digital twin simulation is applied in the updated digital twin simulation. The additional required resource may be an even higher battery level and/or an even stronger gripper applied to the at least one machine associated with the insufficient resource in the original digital twin simulation. The exchange of the insufficient resource for the required resource may be validated when no problem is detected in the updated digital twin simulation.

Figure 3:
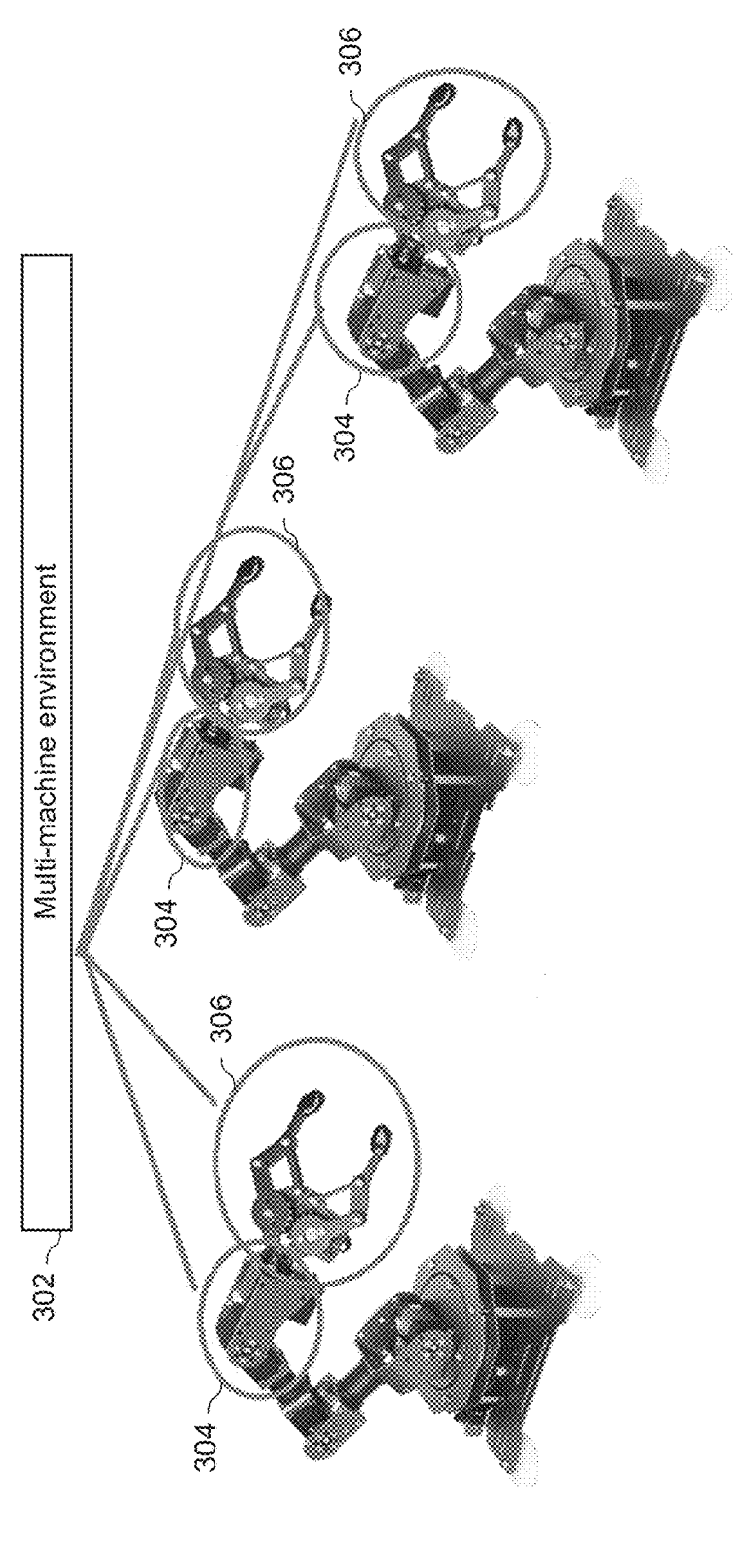
FIG. 3 is an exemplary diagram depicting machines with detachable parts interacting with each other according to at least one embodiment.

Referring now to FIG. 3, an exemplary diagram 300 depicting machines with detachable parts interacting with each other is shown according to at least one embodiment. In the diagram 300, the multi-machine environment 302 comprises a plurality of machines having at least one non-detachable part 304 as well as at least one detachable part 306. The plurality of machines in the multi-machine environment 302 may self-exchange the at least one detachable part 306 between the plurality of machines in both the digital twin simulation described above with respect to the description of FIG. 2 and in the real-world. For example, the at least one detachable part 306 may be a gripper of the plurality of machines. The digital twin simulation described above with respect to the description of FIG. 2 may be executed with the digital twin model of the at least one non-detachable part 304 and the digital twin model of the at least one detachable part 306 assembled to form the digital twin of each machine in the multi-machine environment 302.

According to at least one embodiment, once the resource exchange program 110A, 110B validates the exchange of the insufficient resource for the required resource described above with respect to the description of FIG. 2, the data from the digital twin simulation may be recorded and stored in the AI corpus and/or database 116. In this manner, the data may be used to perform the activity in the real-world effectively.

It may be appreciated that FIGS. 2 and 3 provide only an illustration of one implementation and do not imply any limitations with regard to how different embodiments may be implemented. Many modifications to the depicted environments may be made based on design and implementation requirements.

Figure 4:
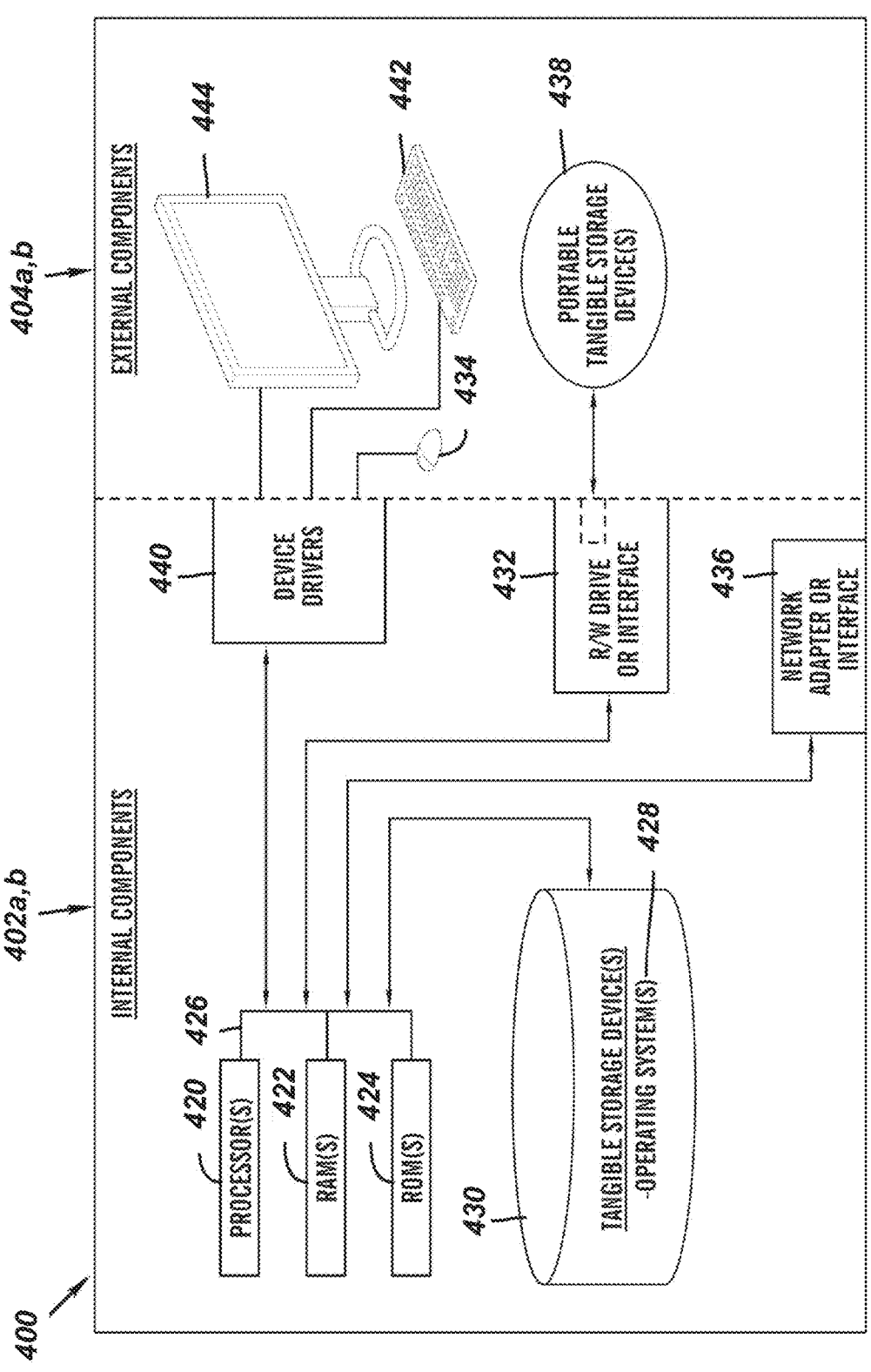
FIG. 4 is a functional block diagram of internal and external components of computers and servers depicted in FIG. 1 according to at least one embodiment.

FIG. 4 is a block diagram 400 of internal and external components of the client computing device 102 and the server 112 depicted in FIG. 1 in accordance with an embodiment of the present invention. It should be appreciated that FIG. 4 provides only an illustration of one implementation and does not imply any limitations with regard to the environments in which different embodiments may be implemented. Many modifications to the depicted environments may be made based on design and implementation requirements.

The data processing system 402, 404 is representative of any electronic device capable of executing machine-readable program instructions. The data processing system 402, 404 may be representative of a smart phone, a computer system, PDA, or other electronic devices. Examples of computing systems, environments, and/or configurations that may represented by the data processing system 402, 404 include, but are not limited to, personal computer systems, server computer systems, thin clients, thick clients, hand-held or laptop devices, multiprocessor systems, microprocessor-based systems, network PCs, minicomputer systems, and distributed cloud computing environments that include any of the above systems or devices.

The client computing device 102 and the server 112 may include respective sets of internal components 402 a,b and external components 404 a,b illustrated in FIG. 4. Each of the sets of internal components 402 include one or more processors 420, one or more computer-readable RAMs 422, and one or more computer-readable ROMs 424 on one or more buses 426, and one or more operating systems 428 and one or more computer-readable tangible storage devices 430. The one or more operating systems 428, the software program 108 and the resource exchange program 110A in the client computing device 102 and the resource exchange program 110B in the server 112 are stored on one or more of the respective computer-readable tangible storage devices 430 for execution by one or more of the respective processors 420 via one or more of the respective RAMs 422 (which typically include cache memory). In the embodiment illustrated in FIG. 4, each of the computer-readable tangible storage devices 430 is a magnetic disk storage device of an internal hard drive. Alternatively, each of the computer-readable tangible storage devices 430 is a semiconductor storage device such as ROM 424, EPROM, flash memory or any other computer-readable tangible storage device that can store a computer program and digital information.

Each set of internal components 402 a,b also includes a RAY drive or interface 432 to read from and write to one or more portable computer-readable tangible storage devices 438 such as a CD-ROM, DVD, memory stick, magnetic tape, magnetic disk, optical disk or semiconductor storage device. A software program, such as the resource exchange program 110A, 110B, can be stored on one or more of the respective portable computer-readable tangible storage devices 438, read via the respective R/W drive or interface 432, and loaded into the respective hard drive 430.

Each set of internal components 402 a,b also includes network adapters or interfaces 436 such as a TCP/IP adapter cards, wireless Wi-Fi interface cards, or 3G or 4G wireless interface cards or other wired or wireless communication links. The software program 108 and the resource exchange program 110A in the client computing device 102 and the resource exchange program 110B in the server 112 can be downloaded to the client computing device 102 and the server 112 from an external computer via a network (for example, the Internet, a local area network or other, wide area network) and respective network adapters or interfaces 436. From the network adapters or interfaces 436, the software program 108 and the resource exchange program 110A in the client computing device 102 and the resource exchange program 110B in the server 112 are loaded into the respective hard drive 430. The network may comprise copper wires, optical fibers, wireless transmission, routers, firewalls, switches, gateway computers and/or edge servers.

Each of the sets of external components 404 a,b can include a computer display monitor 444, a keyboard 442, and a computer mouse 434. External components 404 a,b can also include touch screens, virtual keyboards, touch pads, pointing devices, and other human interface devices. Each of the sets of internal components 402 a,b also includes device drivers 440 to interface to computer display monitor 444, keyboard 442, and computer mouse 434. The device drivers 440, R/W drive or interface 432, and network adapter or interface 436 comprise hardware and software (stored in storage device 430 and/or ROM 424).

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 5:
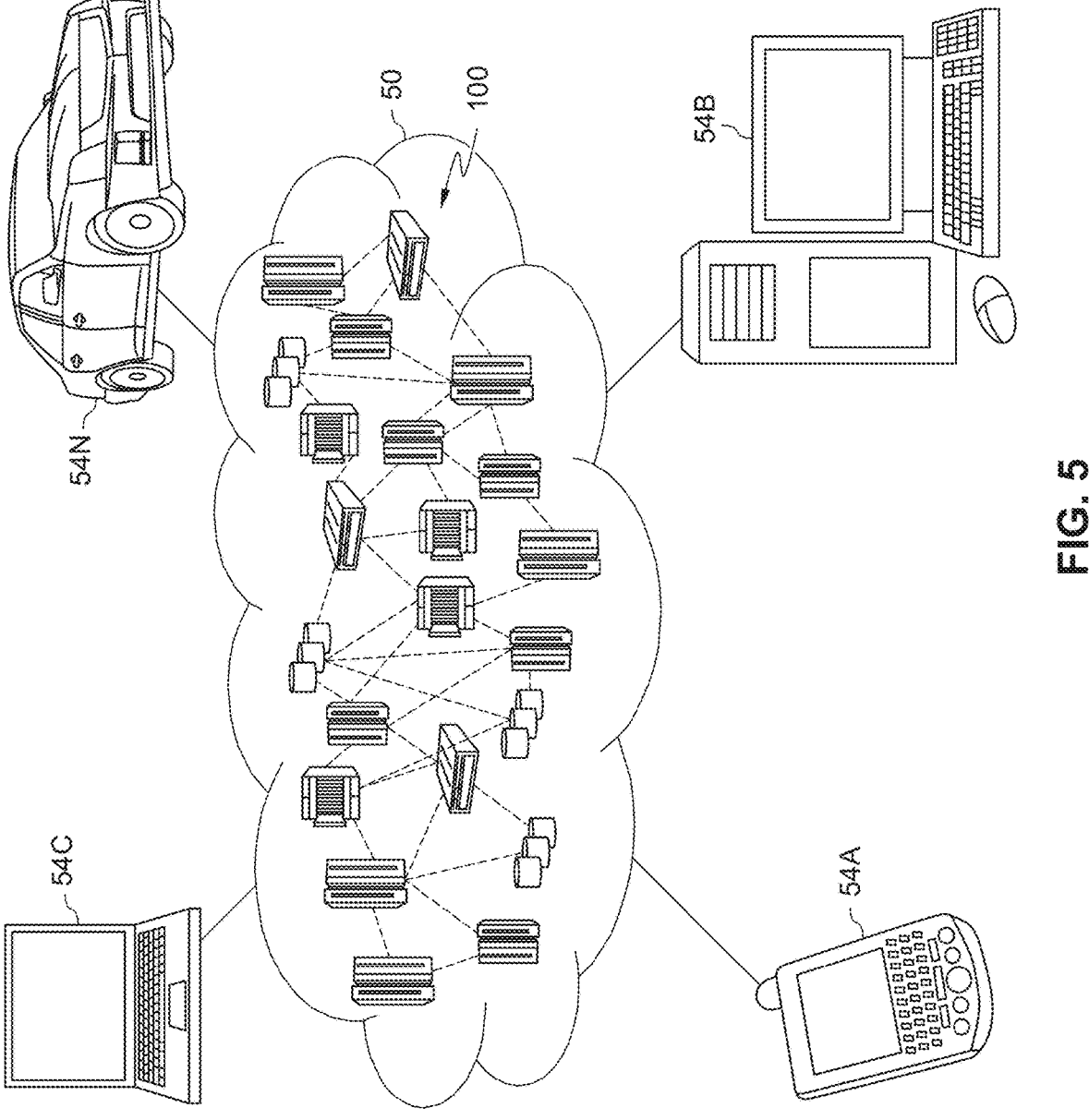
FIG. 5 depicts a cloud computing environment according to an embodiment of the present invention.

Referring now to FIG. 5, illustrative cloud computing environment 50 is depicted. As shown, cloud computing environment 50 comprises one or more cloud computing nodes 100 with which local computing devices used by cloud consumers, such as, for example, personal digital assistant (PDA) or cellular telephone 54A, desktop computer 54B, laptop computer 54C, and/or automobile computer system 54N may communicate. Nodes 100 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 5 are intended to be illustrative only and that computing nodes 100 and cloud computing environment 50 can communicate with any type of computerized device over any type of network and/or network addressable connection (e.g., using a web browser).

Figure 6:
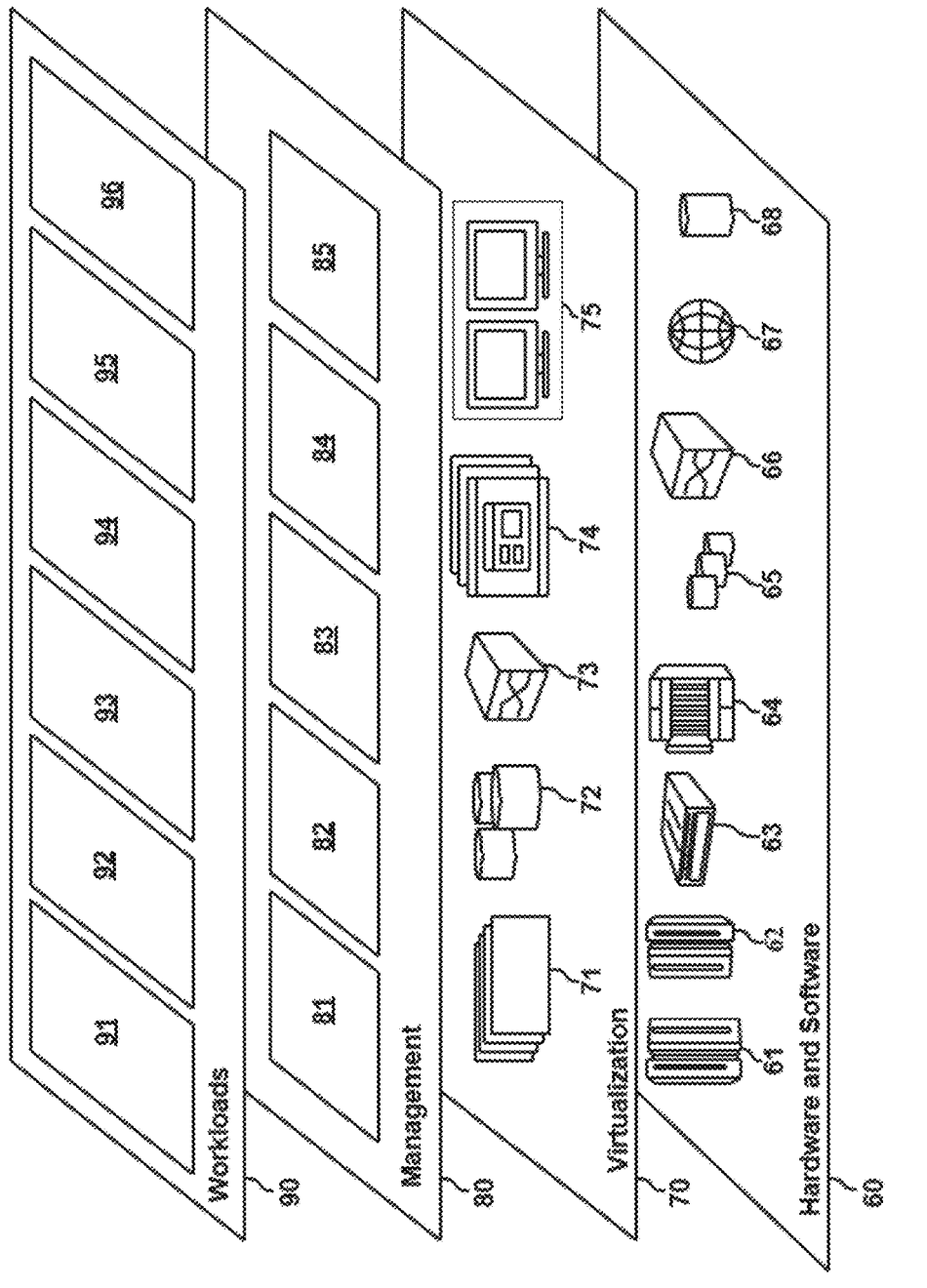
FIG. 6 depicts abstraction model layers according to an embodiment of the present invention.

Referring now to FIG. 6, a set of functional abstraction layers 600 provided by cloud computing environment 50 is shown. It should be understood in advance that the components, layers, and functions shown in FIG. 6 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and simulating an exchange of resources in a multi-machine environment 96. Simulating an exchange of resources in a multi-machine environment 96 may relate to determining whether an insufficient resource associated with a machine (e.g., low battery) is detected during a digital twin simulation in order to exchange the insufficient resource of the machine associated with the insufficient resource for a required resource of a machine having the required resource.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-based method of simulating an exchange of resources in a multi-machine environment, the method comprising:
   receiving data relating to an activity and one or more machines to perform the activity;
   identifying each part of the one or more machines based on the data relating to the one or more machines;
   creating a digital twin model of each identified part of the one or more machines, wherein the digital twin model of each identified part is assembled to form a digital twin of the one or more machines;
   executing a plurality of digital twin simulations of the activity based on the digital twin of the one or more machines and the data relating to the activity, wherein a first digital twin simulation of the plurality of digital twin simulations includes a first digital twin machine having a full battery life and a titanium gripper and a second digital twin machine having a 50% battery life and a plastic gripper, wherein a second digital twin simulation of the plurality of digital twin simulations includes the first digital twin machine having less than the 50% battery life and the titanium gripper and the second digital twin machine having greater than the 50% battery life but less than the full battery life and the plastic gripper;
   determining whether at least one machine of the one or more machines is associated with an insufficient resource to perform the activity based on the plurality of digital twin simulations, wherein the insufficient resource includes a deformity in at least one part of the at least one machine;
   in response to determining the at least one machine is associated with the insufficient resource, identifying a required resource and at least one machine of the one or more machines having the required resource based on the data relating to the one or more machines to perform the activity; and
   directly exchanging the insufficient resource of the at least one machine associated with the insufficient resource for the required resource of the at least one machine having the required resource, wherein the insufficient resource directly exchanged includes the at least one part of the at least one machine having the deformity, wherein the direct exchanging is performed optimally based on a time required to complete the exchange and a time required to complete the activity, wherein a first machine associated with a first insufficient resource has a first required resource and a second machine having a second required resource is associated with a second insufficient resource.

2. The computer-based method of claim 1, further comprising:
   validating the exchange by executing an updated digital twin simulation with the required resource applied to the at least one machine associated with the insufficient resource.

3. The computer-based method of claim 1, wherein identifying each part of the one or more machines further comprises:
   identifying at least one detachable part capable of being self-exchanged between the one or more machines.

4. The computer-based method of claim 2, wherein validating the exchange further comprises:
   exchanging the required resource for an additional required resource in response to determining a problem is detected in the updated digital twin simulation.

5. The computer-based method of claim 1, wherein the required resource is selected from a group consisting of a detachable part capable of performing the activity and an adequate battery level to perform the activity.

6. The computer-based method of claim 5, wherein when the required resource is the adequate battery level to perform the activity, the at least one machine associated with the insufficient resource obtains a charge, via charge sharing, from the at least one machine having the required resource.

7. A computer system, the computer system comprising:
   one or more processors, one or more computer-readable memories, one or more computer-readable tangible storage medium, and program instructions stored on at least one of the one or more computer-readable tangible storage medium for execution by at least one of the one or more processors via at least one of the one or more computer-readable memories, wherein the computer system is capable of performing a method comprising:

receiving data relating to an activity and one or more machines to perform the activity;

identifying each part of the one or more machines based on the data relating to the one or more machines;

creating a digital twin model of each identified part of the one or more machines, wherein the digital twin model of each identified part is assembled to form a digital twin of the one or more machines;

executing a plurality of digital twin simulations of the activity based on the digital twin of the one or more machines and the data relating to the activity, wherein a first digital twin simulation of the plurality of digital twin simulations includes a first digital twin machine having a full battery life and a titanium gripper and a second digital twin machine having a 50% battery life and a plastic gripper, wherein a second digital twin simulation of the plurality of digital twin simulations includes the first digital twin machine having less than the 50% battery life and the titanium gripper and the second digital twin machine having greater than the 50% battery life but less than the full battery life and the plastic gripper;

determining whether at least one machine of the one or more machines is associated with an insufficient resource to perform the activity based on the plurality of digital twin simulations, wherein the insufficient resource includes a deformity in at least one part of the at least one machine;

in response to determining the at least one machine is associated with the insufficient resource, identifying a required resource and at least one machine of the one or more machines having the required resource based on the data relating to the one or more machines to perform the activity; and directly exchanging the insufficient resource of the at least one machine associated with the insufficient resource for the required resource of the at least one machine having the required resource, wherein the insufficient resource directly exchanged includes the at least one part of the at least one machine having the deformity, wherein the direct exchanging is performed optimally based on a time required to complete the exchange and a time required to complete the activity, wherein a first machine associated with a first insufficient resource has a first required resource and a second machine having a second required resource is associated with a second insufficient resource.

8. The computer system of claim 7, further comprising:

validating the exchange by executing an updated digital twin simulation with the required resource applied to the at least one machine associated with the insufficient resource.

9. The computer system of claim 7, wherein identifying each part of the one or more machines further comprises:

identifying at least one detachable part capable of being self-exchanged between the one or more machines.

10. The computer system of claim 8, wherein validating the exchange further comprises:

exchanging the required resource for an additional required resource in response to determining a problem is detected in the updated digital twin simulation.

11. The computer system of claim 7, wherein the required resource is selected from a group consisting of a detachable part capable of performing the activity and an adequate battery level to perform the activity.

12. The computer system of claim 11, wherein when the required resource is the adequate battery level to perform the activity, the at least one machine associated with the insufficient resource obtains a charge, via charge sharing, from the at least one machine having the required resource.

13. A computer program product, the computer program product comprising:

one or more computer-readable tangible storage medium and program instructions stored on at least one of the one or more computer-readable tangible storage medium, the program instructions executable by a processor capable of performing a method, the method comprising:

receiving data relating to an activity and one or more machines to perform the activity;

identifying each part of the one or more machines based on the data relating to the one or more machines;

creating a digital twin model of each identified part of the one or more machines, wherein the digital twin model of each identified part is assembled to form a digital twin of the one or more machines;

executing a plurality of digital twin simulations of the activity based on the digital twin of the one or more machines and the data relating to the activity, wherein a first digital twin simulation of the plurality of digital twin simulations includes a first digital twin machine having a full battery life and a titanium gripper and a second digital twin machine having a 50% battery life and a plastic gripper, wherein a second digital twin simulation of the plurality of digital twin simulations includes the first digital twin machine having less than the 50% battery life and the titanium gripper and the second digital twin machine having greater than the 50% battery life but less than the full battery life and the plastic gripper;

determining whether at least one machine of the one or more machines is associated with an insufficient resource to perform the activity based on the plurality of digital twin simulations, wherein the insufficient resource includes a deformity in at least one part of the at least one machine;

in response to determining the at least one machine is associated with the insufficient resource, identifying a required resource and at least one machine of the one or more machines having the required resource based on the data relating to the one or more machines to perform the activity; and directly exchanging the insufficient resource of the at least one machine associated with the insufficient resource for the required resource of the at least one machine having the required resource, wherein the insufficient resource directly exchanged includes the at least one part of the at least one machine having the deformity, wherein the direct exchanging is performed optimally based on a time required to complete the exchange and a time required to complete the activity, wherein a first machine associated with a first insufficient resource has a first required resource and a second machine having a second required resource is associated with a second insufficient resource.

14. The computer program product of claim 13, further comprising:

validating the exchange by executing an updated digital twin simulation with the required resource applied to the at least one machine associated with the insufficient resource.

15. The computer program product of claim 13, wherein identifying each part of the one or more machines further comprises:

identifying at least one detachable part capable of being self-exchanged between the one or more machines.

16. The computer program product of claim 14, wherein validating the exchange further comprises:

exchanging the required resource for an additional required resource in response to determining a problem is detected in the updated digital twin simulation.

17. The computer program product of claim 13, wherein the required resource is selected from a group consisting of a detachable part capable of performing the activity and an adequate battery level to perform the activity.

\*    \*    \*    \*    \*